(12) United States Patent
Lee et al.

(10) Patent No.: US 10,380,806 B2
(45) Date of Patent: Aug. 13, 2019

(54) SYSTEMS AND METHODS FOR RECEIVING AND DETECTING DIMENSIONAL ASPECTS OF A MALLEABLE TARGET OBJECT

(71) Applicant: Toyota Motor Engineering & Manufacturing North America, Inc., Erlanger, KY (US)

(72) Inventors: Christopher P. Lee, Newark, CA (US); Douglas Moore, Livermore, CA (US); Tiffany Chen, San Jose, CA (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 15/452,298

(22) Filed: Mar. 7, 2017

(65) Prior Publication Data

US 2018/0261015 A1 Sep. 13, 2018

(51) Int. Cl.
*G06T 15/00* (2011.01)
*G06T 19/20* (2011.01)
(Continued)

(52) U.S. Cl.
CPC .............. *G06T 19/20* (2013.01); *G01B 7/28* (2013.01); *G06F 17/50* (2013.01); *G06T 17/00* (2013.01); *G06T 2219/2021* (2013.01)

(58) Field of Classification Search
CPC ....... G06T 17/205; G06T 19/20; G06T 17/00; G06T 2219/2021; G06F 17/50; G01B 7/28
(Continued)

(56) References Cited

U.S. PATENT DOCUMENTS 5,666,712 A 9/1997 Cvetkov
8,321,173 B2 * 11/2012 Wallance .............. G01B 7/003
600/302
(Continued)

OTHER PUBLICATIONS

Jogschies L, Klaas D, Kruppe R, Rittinger J, Taptimthong P, Wienecke A, Rissing L, Wurz MC. Recent developments of magnetoresistive sensors for industrial applications. Sensors. Nov. 12, 2015;15(11):28665-89.*
(Continued)

*Primary Examiner* — Phu K Nguyen
(74) *Attorney, Agent, or Firm* — Dinsmore & Shohl, LLP

(57) ABSTRACT

Systems and methods of receiving and detecting dimensional aspects of a malleable target object are disclosed. A method of receiving dimensional aspects of a malleable target object includes forming the malleable target object from a malleable material including a magnetic component that generates a magnetic field having particular dimensional aspects that correspond to dimensional aspects of the target object, placing the malleable target object within a sensed area such that a sensor senses the particular dimensional aspects of the magnetic field and generates sensed data corresponding to the particular dimensional aspects of the magnetic field, and receiving, from a computing device, the three dimensional computer rendering of the malleable target object. The computing device generates the three dimensional computer rendering from the sensed data and outputs the three dimensional computer rendering such that the three dimensional computer rendering corresponds to the dimensional aspects of the malleable target object.

20 Claims, 5 Drawing Sheets

(51) Int. Cl.
  *G06T 17/00* (2006.01)
  *G06F 17/50* (2006.01)
  *G01B 7/28* (2006.01)
(58) Field of Classification Search
  USPC .......................................................... 345/419
  See application file for complete search history.

(56) References Cited

U.S. PATENT DOCUMENTS

| | | | |
|---|---|---|---|
| 8,493,237 B2 * | 7/2013 | Grievink | G08G 1/042 |
| | | | 340/932.2 |
| 8,504,500 B2 | 8/2013 | Hartmann et al. | |
| 9,420,260 B2 | 8/2016 | McGregor et al. | |
| 9,824,494 B2 * | 11/2017 | Kim | G06T 17/205 |
| 9,900,585 B2 * | 2/2018 | Shark | H04N 13/296 |
| 9,976,964 B2 * | 5/2018 | Fisset | G01N 21/86 |
| 2004/0172150 A1 | 9/2004 | Perot et al. | |
| 2015/0199018 A1 | 7/2015 | Kim et al. | |
| 2015/0343530 A1 | 12/2015 | Duncan et al. | |
| 2016/0242692 A1 | 8/2016 | McAuliffe et al. | |

OTHER PUBLICATIONS

Pelegri JA, Alberola J, Llario V. Vehicle detection and car speed monitoring system using GMR magnetic sensors. InIECON 02 [Industrial Electronics Society, IEEE 2002 28th Annual Conference of the] Nov. 5, 2002 (vol. 2, pp. 1693-1695). IEEE.*

* cited by examiner

SYSTEMS AND METHODS FOR RECEIVING AND DETECTING DIMENSIONAL ASPECTS OF A MALLEABLE TARGET OBJECT

TECHNICAL FIELD

The present specification generally relates systems and methods for sensing dimensional aspects of a target object in a three dimensional (3D) space and, more specifically, to systems and methods for detecting dimensional aspects based on components integrated within the target object.

BACKGROUND

With the increasing use of computer aided design (CAD) to create virtual three dimensional (3D) models for electronic manipulation and generation of physical components therefrom, there has been a focus on generating an initial virtual 3D model. Current methods require the virtual 3D model to be created wholly within a CAD program from scratch, without the use of an initial physical model. However, such current methods are not suitable for individuals who do not have extensive 3D design/CAD programming experience.

Some other current methods include the use of 3D scanners to scan a physical object and generate a 3D model therefrom. However, these methods require experienced users that are well-versed with 3D scanners to be able to appropriately manipulate the scanners and the software used to create a virtual 3D model of the physical object. Moreover, such methods would necessarily require access to 3D scanners, which are currently expensive and not widely available. Such methods also do not allow for real-time manipulation of the physical object to modify the virtual 3D model generated therefrom, as the 3D scanning process is time consuming and data intensive. Finally, such methods do not accurately generate a virtual 3D model from the physical object because the 3D scanners are only adapted to scan exterior surfaces of the physical object and cannot be used to determine internal connections within the physical object.

Accordingly, a need exists for systems and methods that can be used to accurately construct a virtual 3D model of a physical object in real time such that the physical object can be continuously manipulated and/or molded by a user to update the virtual 3D model.

SUMMARY

In one embodiment, method of receiving dimensional aspects of a malleable target object includes forming the malleable target object from a malleable material including a magnetic component that generates a magnetic field having particular dimensional aspects that correspond to dimensional aspects of the target object, placing the malleable target object within a sensed area such that a sensor senses the particular dimensional aspects of the magnetic field and generates sensed data corresponding to the particular dimensional aspects of the magnetic field, and receiving, from a computing device, the three dimensional computer rendering of the malleable target object. The computing device generates the three dimensional computer rendering from the sensed data and outputs the three dimensional computer rendering such that the three dimensional computer rendering corresponds to the dimensional aspects of the malleable target object.

In another embodiment, a method of detecting dimensional aspects of a malleable target object includes directing, by a processing device, a sensor to sense particular dimensional aspects of a magnetic field generated by the malleable target object, where the particular dimensional aspects of the magnetic field corresponds to dimensional aspects of the malleable target object, receiving, by the processing device, sensed data from the sensor, the sensed data corresponding to the particular dimensional aspects of the magnetic field, and generating, by the processing device, a three dimensional rendering of the malleable target object from the sensed data.

In yet another embodiment, a system for detecting dimensional aspects of a malleable target object includes a sensor, a processing device communicatively coupled to the sensor, and a non-transitory, processor-readable storage medium. The non-transitory, processor-readable storage medium comprising one or more programming instructions that, when executed, cause the processing device to direct the sensor to sense particular dimensional aspects of a magnetic field generated by the malleable target object, where the particular dimensional aspects of the magnetic field corresponds to dimensional aspects of the malleable target object, receive sensed data from the sensor, the sensed data corresponding to the particular dimensional aspects of the magnetic field, and generate a three dimensional rendering of the malleable target object from the sensed data.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

The embodiments described herein are generally directed to systems and methods for sensing dimensional aspects of a particular malleable target object to obtain sensed data, transforming the sensed data into 3D model data, generating a virtual 3D model (e.g., a three dimensional computer rendering) from the 3D model data, and providing the 3D model to a user via a user interface that allows the user to manipulate the 3D model for various other purposes (e.g., manipulation for illustration, reproduction, and/or the like). The systems and methods described herein allow for a continuously updated 3D model such that, as the malleable target object is physically reshaped, the 3D model is correspondingly updated in real time. This affords users greater flexibility in forming a 3D model that exactly matches desired specifications without a need to be experienced with CAD programming. In addition, the 3D model more accurately represents the malleable target object with respect to other 3D models created via other methods because it accounts for internal connections between structural components of the target object.

Figure 1A:
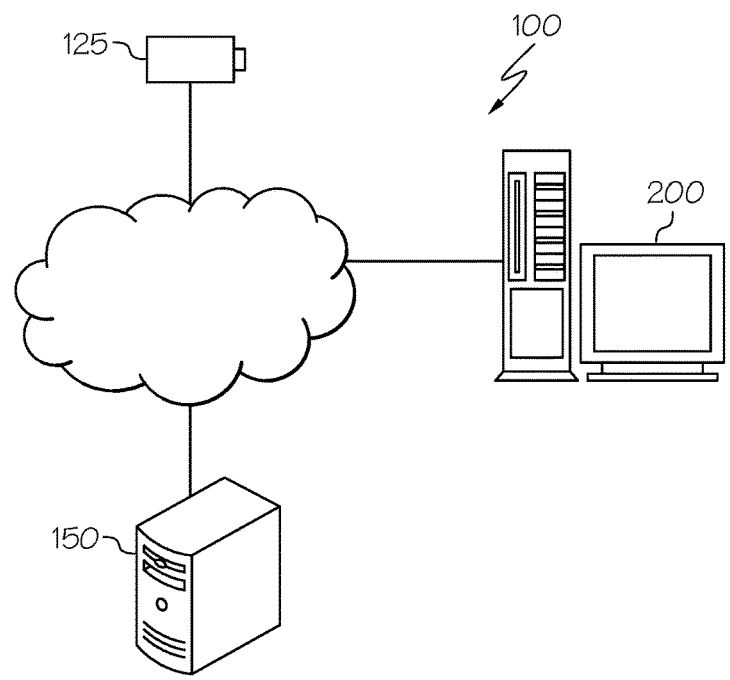
FIG. 1A schematically depicts an illustrative computing network for a system to sense dimensional aspects of a target object and generate a virtual 3D model therefrom according to one or more embodiments shown and described herein.

FIG. 1A depicts an illustrative computing network for a system to sense dimensional aspects of a target object and generate a virtual 3D model therefrom according to embodiments shown and described herein. As illustrated in FIG. 1A, a computer network 100 may include a wide area network (WAN), such as the Internet, a local area network (LAN), a mobile communications network, a public service telephone network (PSTN), a personal area network (PAN), a metropolitan area network (MAN), a virtual private network (VPN), and/or another network. The computer network 100 may generally be configured to electronically connect one or more computing devices and/or components thereof, and/or one or more sensing devices. Illustrative computing devices may include, but are not limited to, a user computing device 200 and a server computing device 150. An illustrative sensing device may include, but is not limited to, a sensor 125 that obtains sensed data regarding a target, as described in greater detail herein. The user computing device 200 and the sensor 125 may be separate devices as shown in FIG. 1A or may be integrated into a single device.

The sensor 125 is not limited by this disclosure, and may generally be any device that senses one or more properties of a target, captures images, captures image-related data (e.g., raw scan data), obtains measurements, and/or generates a point cloud. In addition, the sensor 125 may transmit data in the form of sensed data, image data, measurement data, and/or point cloud related data. In particular embodiments, the sensor 125 may be a magnetic sensor that senses magnetic properties of a target and transmits data corresponding to the magnetic properties. The magnetic properties may be used to determine a shape, size, position, and/or orientation of a target object, as described in greater detail herein. Nonlimiting examples of a magnetic sensor may include a Hall sensor that uses the Hall effect, a giant magnetoresistance (GMR) sensor in which the giant magnetoresistance effect is used, an anisotropic magnetoresistance (AMR) sensor in which the anisotropic magnetoresistance effect is used, a magnetoresistive waveguide, an electronic compass unit, and/or the like. Other magnetic sensors now known or later developed may also be used without departing from the scope of the present disclosure. In some embodiments, the sensor 125 may also incorporate a 3D scanner, including a laser-based scanner, a LIDAR system, and/or the like. In some embodiments, the sensor 125 may include a camera, a camcorder, or the like, and may incorporate an image sensor, an image processor, an optical element, and/or the like. In some embodiments, the sensor 125 may be capable of zooming in and out and may further be capable of moving, such as, for example, panning, tilting, moving along a guide, and/or the like.

While a single sensor 125 is depicted herein, the number of sensors is not limited by this disclosure and may generally be any number thereof. In a nonlimiting example, a plurality of sensors may be used to capture various angles of a particular target. In another nonlimiting example, a single sensor 125 may be used to capture various angles of a particular target by moving relative to the target.

The sensor 125 may be mounted to any stationary or moving apparatus that provides the sensor 125 with the capability of sensing a target as described herein. For example, the sensor 125 may be coupled to an arm or other support that allows the sensor 125 to move about an axis around a target such that the sensor 125 can capture any angle of a particular target. In some embodiments, movement of the sensor 125 may be remotely controlled by a user (i.e., via the user computing device 200).

In some embodiments, the sensor 125 may be integrated into a device that supports target object thereon. For example, the sensor 125 (or plurality of sensors) may be embedded in a table, a platform, or the like, which supports the target object and senses the properties of the target object, as described in greater detail herein.

The user computing device 200 may generally be used as an interface between a user and the other components connected to the computer network 100, and/or various other components communicatively coupled to the user computing device 200 (such as components communicatively coupled via one or more networks to the user computing device 200), whether or not specifically described herein. Thus, the user computing device 200 may be used to perform one or more user-facing functions, such as receiving inputs from a user or providing information to the user. Additionally, in the event that the server computing device 150 requires updating, correction, and/or the like, the user computing device 200 may provide the desired updating, correction, and/or the like.

The server computing device 150 may receive electronic data and/or the like from one or more sources (e.g., the sensor 125, the user computing device 200, and/or one or more databases). In addition, the server computing device 150 may direct operation of one or more other devices (e.g., the sensor 125 and/or the user computing device 200), generate model data from sensed data, generate a 3D model, and/or the like. In some embodiments, the server computing device 150 may direct the sensor 125 to move relative to a particular target, direct the sensor 125 to zoom in or out, and/or direct the sensor 125 to capture data, as described in greater detail herein.

It should be understood that while the user computing device 200 is depicted as a personal computer and the server computing device 150 is depicted as a server, these are nonlimiting examples. More specifically, some embodiments may be configured with any type of computing device (e.g., mobile computing device, personal computer, server, etc.) to perform the described functionality. Additionally, while each of these computing devices is illustrated in FIG. 1A as a single piece of hardware, this is also merely an example. More specifically, each of the user computing device 200 and the server computing device 150 may represent a plurality of computers, servers, databases, components, and/or the like.

It should also be understood that while the embodiments depicted herein refer to a network of computing devices, the present disclosure is not solely limited to such a network. For example, the various processes described herein may be completed by a single computing device, such as a non-networked computing device or a networked computing device that does not use the network to complete the various processes described herein.

Figure 1B:
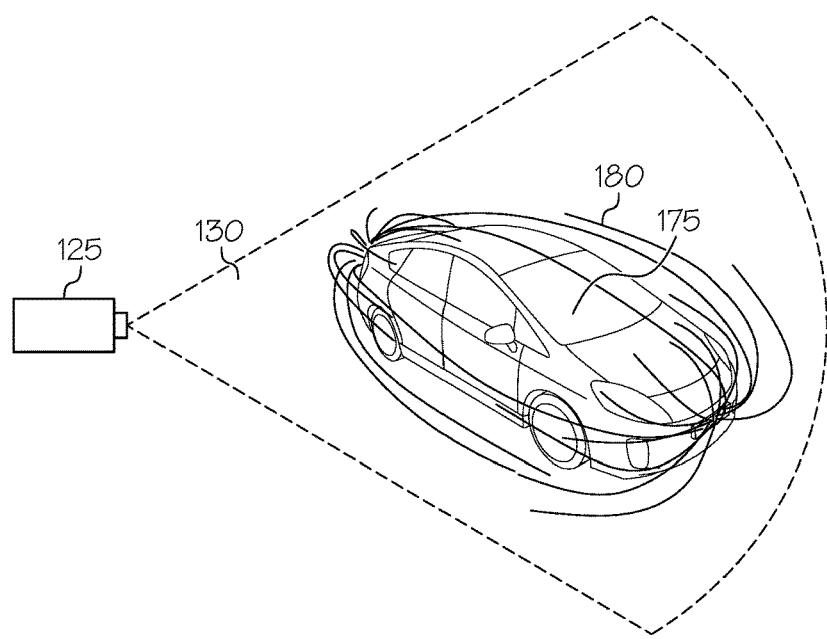
FIG. 1B schematically depicts an illustrative sensed area of a sensor according to one or more embodiments shown and described herein.

FIG. 1B schematically depicts an illustrative sensed area 130 of a sensor 125 according to one or more embodiments shown and described herein. As shown in FIG. 1B, the sensor 125 is positioned to sense various aspects of any target that is located within a sensed area 130 (e.g., the area bound by the dashed lines). The sensor 125 may obtain sensed data regarding dimensional aspects (e.g., shape, size, position, and/or orientation) of a target object 175 within the sensed area 130. In addition, the sensor 125 may determine an orientation of the target object 175 (or a portion thereof) relative to the sensor 125, other objects, other portions of the target object 175, and/or the like when the target object 175 is positioned within the sensed area 130.

In various embodiments, the sensor 125 may be positioned adjacent to the target object 175 such that at least a portion of the target object 175 is located within the sensed area 130. As such, the sensor 125 may generally be positioned such that the sensor 125 senses at least a portion of the target object 175. For example, in embodiments where a plurality of sensors are used, each of the plurality of sensors may have its own particular sensing axis. In addition, each individual sensor 125 is oriented such that each respective sensing axis is at a different angle relative to the target object 175. In embodiments where a single sensor 125 is used, the sensor 125 may have a sensing axis and movement (e.g., rotation) of the sensor 125 that causes the sensing axis to continuously reorient at a plurality of different angles relative to the target object 175.

The target object 175 (which may also be referred to as a physical target object or a malleable target object) is generally a malleable compound that can be physically formed, deformed, shaped, reshaped, and/or the like by a user. For example, the target object 175 may comprise a malleable clay, a clay-like composition, a dough, and/or the like. As such, a user may manipulate the target object 175 to form it into any desired shape and/or place it into any desired position and/or orientation.

The target object 175 may also contain components that give the target object 175 certain properties that can be detected by the sensor 125 for the purposes of determining particular dimensional aspects of the target object 175, such as a shape, a size, a configuration, a position, and an orientation of the target object 175, as described herein. As a nonlimiting example, the target object 175 may contain materials that have magnetic properties. Accordingly, when the sensor 125 includes a magnetic sensor, the sensor 125 can detect the magnetic properties of the target object 175 and determine dimensional aspects of the target object 175 based on the magnetic properties. That is, the magnetic components of the target object 175 each generate a magnetic field 180 that has particular dimensional aspects.

As should be generally understood, such particular dimensional aspects of each magnetic field 180 can be determined by the sensor 125 by measuring a strength, a direction, and/or the like of the magnetic field in a plurality of different locations with respect to a point on the target object 175. Since the magnetic components are dispersed throughout the malleable material of the target object, the dimensional aspects of the target object 175 can be accurately determined from the particular dimensional aspects of all of the magnetic fields 180 when viewed as a whole. Illustrative examples of materials that may be used to form a target object 175 having magnetic properties may include, but are not limited to, iron, nickel, cobalt, manganese, a metallic alloy of any of the foregoing, carbonyl iron, chromium dioxide, a magnetic iron oxide, a magnetic ferrite, a magnetic hexaferrite, a magnetic garnet, and/or the like.

Figure 2A:
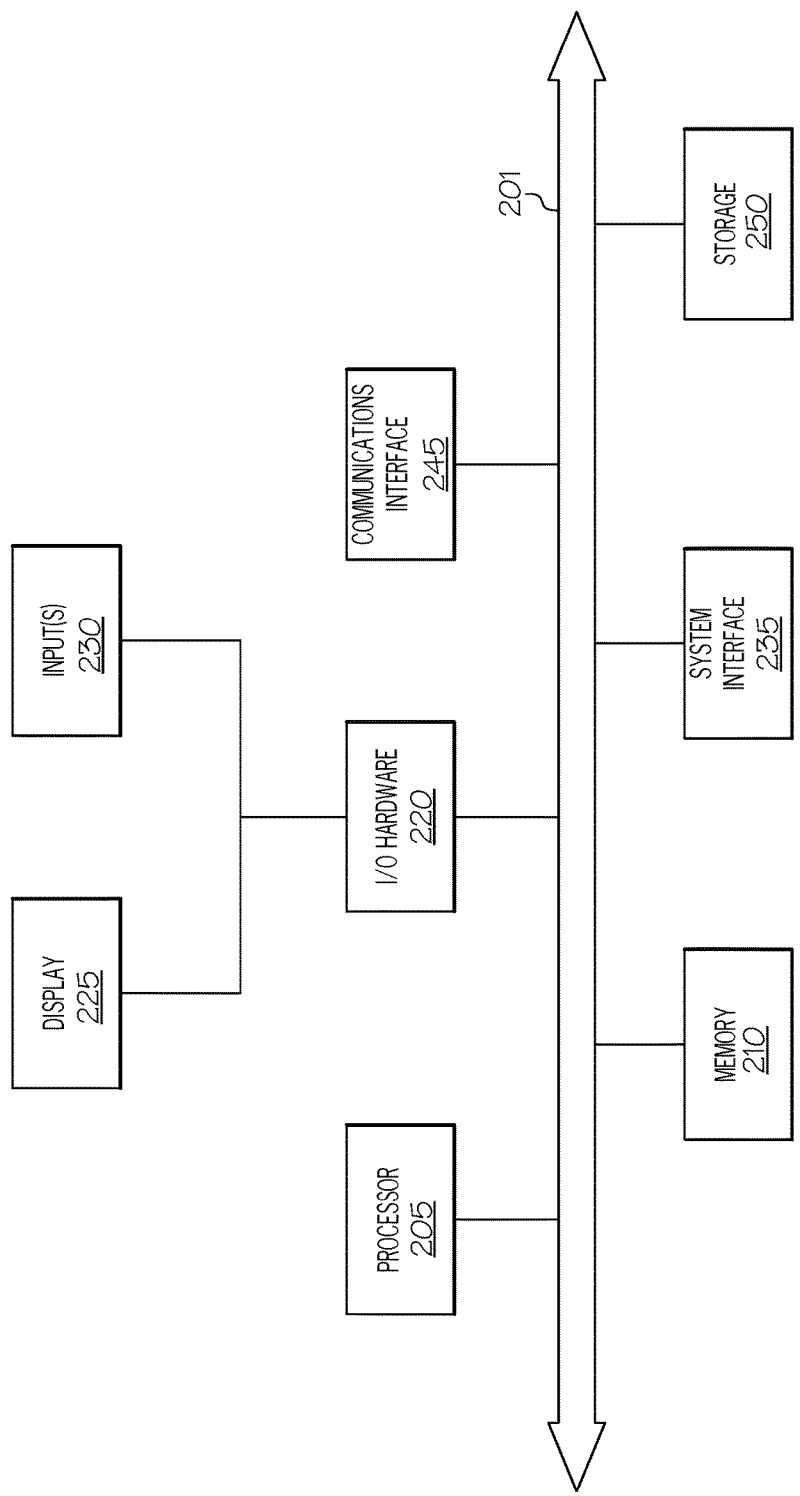
FIG. 2A schematically depicts a block diagram of illustrative hardware of a computing device according to one or more embodiments shown and described herein.

FIG. 2A schematically depicts a block diagram of illustrative hardware of a computing device (e.g., the user computing device 200) according to one or more embodiments shown and described herein. While the components described herein are specifically directed to the user computing device 200, it should be understood that such components may also be present in the server computing device 150 without departing from the scope of the present disclosure. In some embodiments, a first portion of the components described with respect to FIG. 2A may be contained within the server computing device 150 and a second portion of the components may be contained within the user computing device 200.

A bus 201 may interconnect the various components. A processing device 205, such as a computer processing unit (CPU), may be the central processing unit of the computing device, performing calculations and logic operations to execute a program. The processing device 205, alone or in conjunction with the other components, is an illustrative processing device, computing device, processor, or combination thereof. Memory 210, such as read only memory (ROM) and/or random access memory (RAM), may constitute an illustrative memory device and/or a non-transitory processor-readable storage medium. The memory 210 may include one or more programming instructions thereon that, when executed by the processing device 205, cause the processing device 205 to complete various processes, such as the processes described herein. In some embodiments, the program instructions may be stored on a tangible computer-readable medium that may be removable, such as a compact disc, a digital disk, flash memory, a memory card, a USB drive, an optical disc storage medium, such as a Blu-ray™ disc, and/or other non-transitory processor-readable storage media. Similarly, the program instructions stored on the memory 210 may be embodied as a plurality of software logic modules, where each logic module provides programming instructions for completing one or more tasks, as described in greater detail hereinbelow with respect to FIG. 2B.

A storage device 250, which may generally be a storage medium, may contain one or more data repositories for storing data that is used for storing data that is received from the sensor 125 (FIG. 1A) and/or generated model data. The storage device 250 may be any physical storage medium, including, but not limited to, a hard disk drive (HDD), memory, removable storage, and/or the like. While the storage device 250 is depicted as a local device, it should be understood that the storage device 250 may be a remote storage device, such as, for example, a server computing device or the like (e.g., the server computing device 150 of FIG. 1A). Illustrative data that may be contained within the storage device 250 is described hereinbelow with respect to FIG. 2C.

Still referring to FIG. 2A, I/O hardware 220 may communicate information from the bus 201 to be displayed on a display 225 portion of the computing device in audio, visual, graphic, or alphanumeric format. Moreover, the I/O hardware 220 may also include one or more inputs 230 that allow for transmission to and receipt of data from input devices such as a keyboard, a mouse, a joystick, a touch screen, a remote control, a pointing device, a video input device, an audio input device, a haptic feedback device, and/or the like. Such a input/output (I/O) hardware 220 may be used, for example, to allow a user to interact with the computing device or any component thereof.

A system interface 235 may generally cause the computing device to interface with one or more of the components of the computer network 100 (FIG. 1A), such as, for example, the sensor 125. Communication with such components may occur using various communication ports (not shown). An illustrative communication port may be attached to a communications network, such as the Internet, an intranet, a local network, a direct connection, and/or the like.

A communications interface 245 may generally cause the computing device to interface with one or more external components, such as, for example, an external computing device, a remote server, and/or the like. Communication with external devices may occur using various communication ports (not shown). An illustrative communication port may be attached to a communications network, such as the Internet, an intranet, a local network, a direct connection, and/or the like.

Figure 2B:
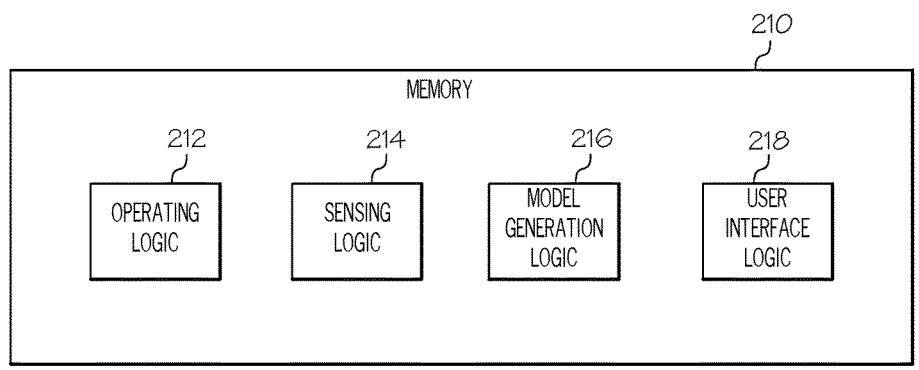
FIG. 2B schematically depicts a block diagram of software modules contained within a memory of a computing device according to one or more embodiments shown and described herein.

In some embodiments, the program instructions contained on the memory 210 may be embodied as a plurality of software modules, where each module provides programming instructions for completing one or more tasks. For example, FIG. 2B schematically depicts a block diagram of software modules contained within a memory (e.g., the memory 210) of a computing device according to one or more embodiments shown and described herein. The memory 210 may contain operating logic 212, sensing logic 214, model generation logic 216, and/or user interface logic 218. The operating logic 212 may include an operating system and/or other software for managing components of a computing device. The sensing logic 214 may include one or more software modules for directing a sensor to sense a target object, directing a sensor to move, and/or receiving sensed data from the sensor. The model generation logic 216 may include one or more software modules for evaluating sensed data received from a sensor, generating model data from the sensed data, generating a 3D model from the model data, and/or updating the 3D model based on additional received sensed data.

Figure 2C:
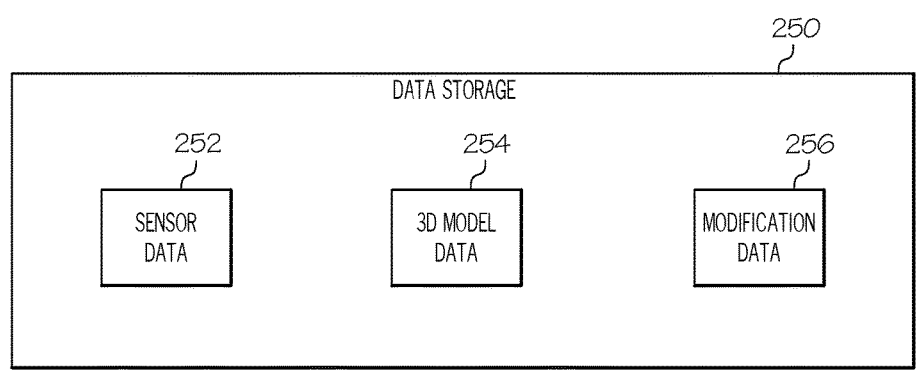
FIG. 2C schematically depicts a block diagram of various data contained within a storage device of a computing device according to one or more embodiments shown and described herein.

FIG. 2C schematically depicts a block diagram of various data contained within a storage device (e.g., the storage device 250) of a computing device according to one or more embodiments shown and described herein. As shown in FIG. 2C, the storage device 250 may include, for example, sensor data 252, 3D model data 254, and/or modification data 256. Sensor data 252 may include, for example, data that is generated by the sensor 125 (FIG. 1A) and is subsequently used for evaluation. In some embodiments, sensor data 252 may include data that is received by the sensor 125 during the course of sensing the target object 175 (FIG. 1A). 3D model data 254 may include, for example, data relating to a nominal object. That is, the 3D model data 254 includes data that can be used by a computing device to generate a 3D model (which may also be referred to as a three dimensional rendering) therefrom. Examples of information contained within the 3D model data 254 that can be used to generate a 3D model include, but are not limited to, a shape of the nominal object (e.g., dimensional aspects such as shape, size, orientation, positioning, configuration, and/or the like), a curvature of the nominal object at one or more locations, locations of various structural components of the nominal object, relative orientation of various components of the nominal object, and/or the like. The 3D model data may be any type of reference data, such as CAD data or the like. Modification data 256 may include, for example, data generated as a result of providing a user interface to a user that contains a 3D model and receiving inputs from the user that correspond to modifications of various aspects of the 3D model, as described in greater detail herein.

It should be understood that the components illustrated in FIGS. 2A-2C are merely illustrative and are not intended to limit the scope of this disclosure. More specifically, while the components in FIGS. 2A-2C are illustrated as residing within the user computing device 200 (FIG. 1), this is a nonlimiting example. In some embodiments, one or more of the components may reside external to the user computing device 200, such as with the server computing device 150. Similarly, one or more of the components may be embodied in other computing devices not specifically described herein.

Figure 3:
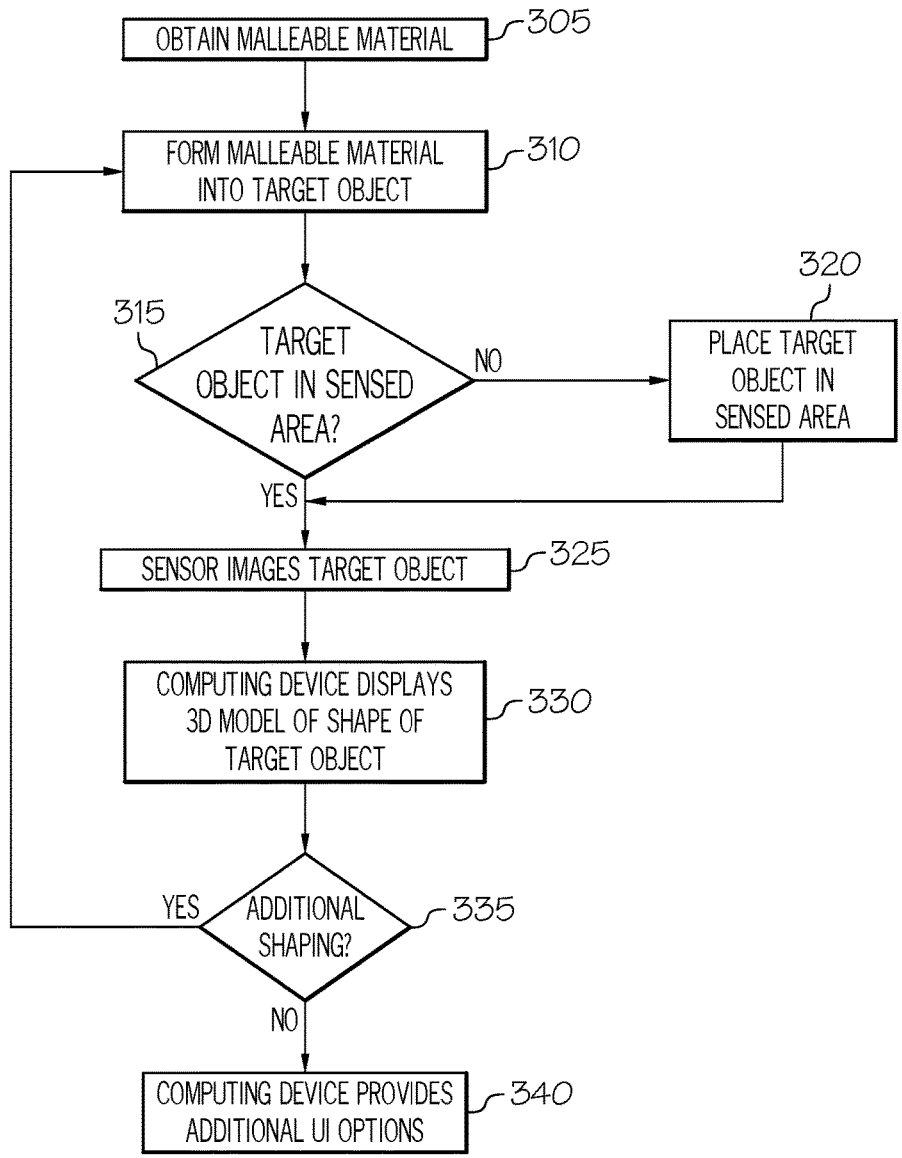
FIG. 3 depicts a flow diagram of an illustrative method forming a physical object and obtaining and manipulating a virtual 3D model formed therefrom according to one or more embodiments shown and described herein.

FIG. 3 depicts a flow diagram of an illustrative method forming a physical object and obtaining and manipulating a virtual 3D model formed therefrom according to one or more embodiments shown and described herein. The method described with respect to FIG. 3 may generally be completed by any user to generate a 3D model without the need for expensive and complicated imaging equipment and/or knowledge of complex CAD programming. Moreover, the resulting 3D model may accurately account for internal connections between various components of the physical object. In some embodiments, the method described with respect to FIG. 3 may be completed by an individual desiring to generate a 3D model by forming a malleable material to a desired shape.

While also referring to FIGS. 1A-1B and 2A-2C, a malleable material may be obtained at block 305. As previously described herein, the malleable material is generally an amount of material that can be molded by a user into a desired shape, size, configuration, positioning, orientation, and/or the like. In addition, the malleable material contains one or more components that exhibit magnetic properties such that the shape, size, configuration, positioning, and orientation of the magnetic material can be detected based on magnetic fields produced by the one or more components of the magnetic material. That is, the malleable material itself may be made up of magnetic components (e.g., the magnetic components themselves exhibit malleable properties) and/or magnetic components may be embedded in the malleable material.

At block 310, the malleable material may be formed into the target object 175. Forming the malleable material may include, for example, hand forming, forming with tools, forming with mechanical devices, and/or the like. The malleable material may be formed while located within the sensed area 130 or may be formed outside the sensed area 130 and subsequently placed within the sensed area 130. As will be described herein, forming may occur continuously, causing the 3D model to be generated and updated in real-time.

At block 315, a determination may be made as to whether the target object 175 formed from the malleable material is within the sensed area 130. If the target object 175 is not within the sensed area 130, it may be placed within the sensed area 130 at step 320.

Once the target object 175 is placed within the sensed area 130, the target object 175 may be sensed by the sensor 125 at block 325. That is, the sensor 125 may detect the magnetic field(s) 180 generated by the magnetic material within the target object 175 and obtain/generate data that can be used to determine the shape, size, configuration, position, and/or orientation of the target object 175 based on the detected shape of the magnetic field(s) 180. Such data may be stored, for example, as a portion of the sensor data 252 of the storage device 250. The sensor 125 may obtain/generate data, for example, by identifying one or more nodes, determining a coordinate positioning (e.g., x, y, z) of each of the one or more nodes, and/or determining an inertial movement at each node (e.g., $1_x$, $1_y$, $1_z$), which allows a particular shape, size, configuration, position, and orientation of each of the one or more notes to be determined. This information may be used to generate the data that is used to determine the shape, a size, a configuration, a position, and an orientation of the target object 175.

At block 330, the user computing device 200 may display a 3D model corresponding to the detected shape, position, and/or orientation of the target object 175. That is, the display 225 may be directed by the processing device 205 to display an image of the 3D model. The 3D model may be generated by the processing device 205 by using the data obtained from the sensor 125 as well as other data, as described in greater detail herein.

At block 335, a determination may be made as to whether additional shaping occurs, and if so, the process may return to block 310. That is, if a user desires to further shape, reposition, and/or reorient the target object 175, he/she may do so at any time. Reshaping, repositioning, and/or reorienting the target object 175 causes the processes depicted with respect to blocks 310-330 to be repeated such that the 3D model is updated in real-time to correspond to the shape of the target object 175. As a nonlimiting example, the user may determine that the 3D model does not conform to desired specifications, and instead of having to rely on CAD programming knowledge to update the 3D model to conform to the desired specifications, the user merely reshapes the target object 175. Accordingly, the target object 175 is re-sensed and the 3D model is regenerated automatically. It should be understood that the determination at block 335 can be completed at any time a change in shape of the target object 175 is detected.

In addition to displaying the 3D model, the user computing device 200 may also provide additional user interface options to the user at block 340. That is, the user computing device 200 may provide user interface options for altering the 3D model, transmitting the 3D model, providing the 3D model as an illustration, reproducing the 3D model, and/or the like. Such additional user interface options may be provided, for example, by the processing device 205 in directing the display 225 to display the options and/or receiving inputs via the inputs 230.

Figure 4:
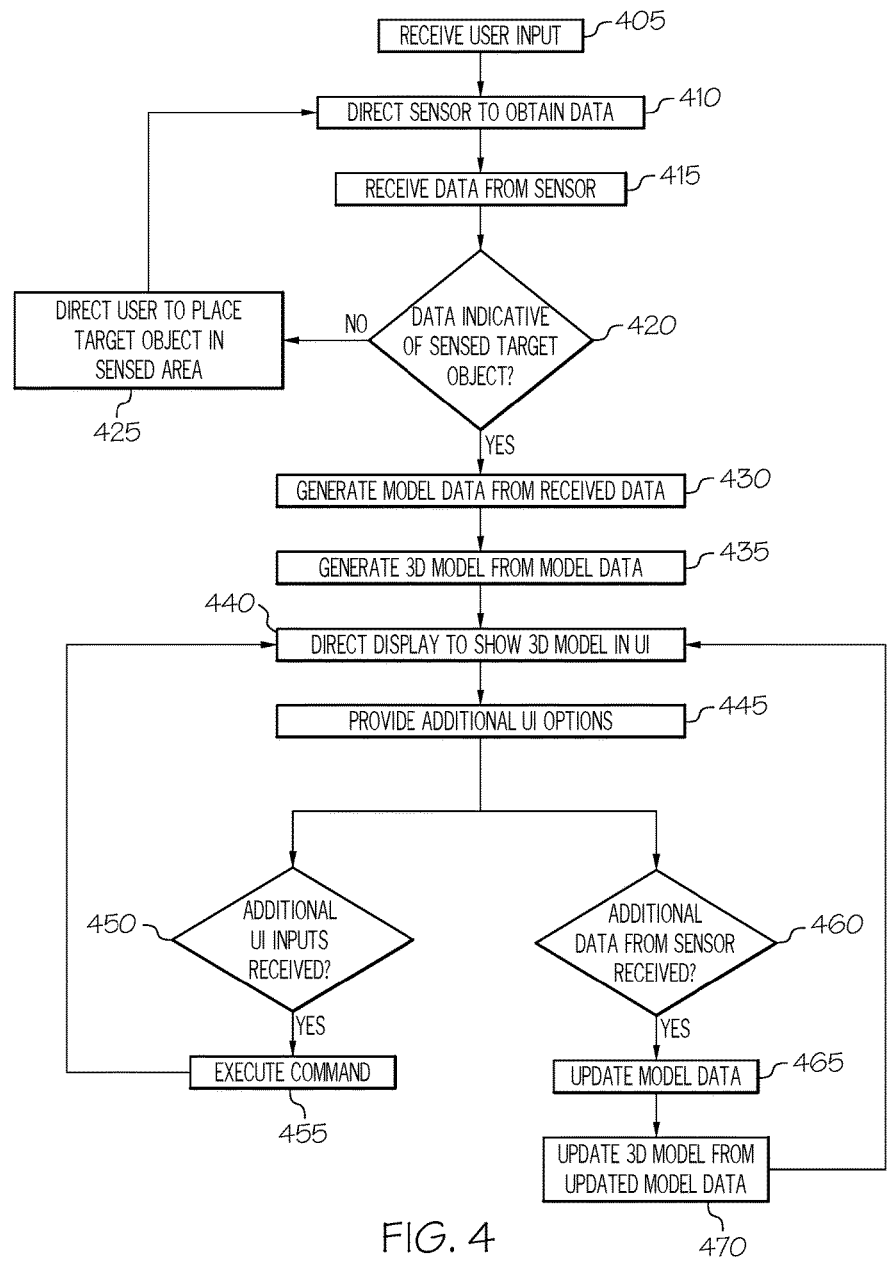
FIG. 4 depicts a flow diagram of an illustrative method of sensing a physical object and generating a virtual 3D model therefrom according to one or more embodiments shown and described herein.

FIG. 4 depicts a flow diagram of an illustrative method of sensing a physical object and generating a virtual 3D model therefrom according to one or more embodiments shown and described herein. The processes described with respect to FIG. 4 may generally be completed by the various components of the user computing device 200 and/or the server computing device 150. For example, some embodiments may be configured such that the processing device 205 of the user computing device 200 carries out the various processes described with respect to FIG. 4.

At block 405, a user input may be received. In some embodiments, the user input may be received via the input 230. The user input generally provides an indicator of a user request to have the target object 175 detected for the purposes of rendering a 3D model. The input may be, for example, clicking a "START" icon, powering on one or more components, and/or the like.

At block 410, the sensor 125 may be directed to obtain data. As such, the sensor 125 may begin sensing the sensed area 130 and transmitting the corresponding sensed data to be stored as the sensor data 252. Directing the sensor 125 may include, for example, transmitting a signal to the sensor 125, powering on the sensor 125, directing the sensor 125 to move to a position and/or orientation suitable for sensing, and/or the like. Directing the sensor 125 may also include accessing information contained within the sensing logic 214 of the memory 210.

At block 415, the sensed data may be received from the sensor 125. In some embodiments, the sensed data may be received via the system interface 235. In some embodiments, the sensed data may be obtained from the sensor data 252 within the storage device 250. That is, the sensor 125 may direct the storage device 250 to store the sensed data as the sensor data 252, which is subsequently retrieved at block 415.

To ensure that the target object 175 is appropriately located within the sensed area 130 for the purposes of sensing the shape, size, orientation, and/or the like, a determination may be made at block 420 as to whether the received sensed data is indicative of a target object. That is, the determination may include analyzing the sensed data to determine whether one or more magnetic fields exist (e.g., have been detected by the sensor 125).

If the data is not indicative of a sensed target object (e.g., data that indicates no magnetic fields were detected or only very weak magnetic fields were detected), the user may be directed at block 425 to place the target object 175 in the sensed area 130. For example, the display 225 may be directed to display a message directing the user to place the target object 175 in the sensed area 130. The message may include, for example, text, photographs, diagrams, video, and/or the like. In addition, audio, haptic feedback, or the like may also be provided by means other than the display 225, such as via speakers, haptic feedback components, or the like. The process may then return to block 410 for further sensing.

If the data is indicative of a sensed target object (e.g., data that indicates at least one magnetic field was detected), model data may be generated at block 430. That is, the sensed data may be analyzed and interpreted to generate data corresponding to a model. More specifically, the sensed data may be analyzed to determine the particular dimensional aspects of the magnetic field(s) 180 that were detected. Once the particular dimensional aspects of the magnetic fields are determined, the model data may be generated based on the determined particular dimensional aspects of the magnetic fields. In some embodiments, certain programming may provide translation information for translating the detected particular dimensional aspects of the magnetic field 180 into model data that corresponds with a determined shape of the target object 175. Such programming may be contained within the model generation logic 216 of the memory 210. In some embodiments, the model data may be stored as the 3D model data 254 in the storage device 250.

At block 435, the 3D model may be generated from the model data. That is, the 3D model may be rendered for display via the display 225 such that it is viewable by the user. In some embodiments, creation of the 3D model may utilize certain programming from the model generation logic 216 of the memory 210.

The rendered 3D model may be displayed to the user by directing the display 225 to display the 3D model in a user interface at block 440. In addition to displaying the 3D model, one or more additional user interface options may be provided via the display 225 at block 445. For example, options for altering the 3D model (e.g., changing a color or the like), reproducing the 3D model, transmitting the 3D model, and/or the like may also be presented via the display 225. If a user selects one of the provided options (e.g., a determination is made at block 450 that the user has provided inputs corresponding to the selected options), a corresponding command may be executed at block 455.

For example, if the user selects, via the user interface, to transmit the 3D model, a corresponding command may be to open an email program and generate a new email message containing the 3D model therein. In another example, if the user selects, via the user interface, to change the 3D model, a corresponding command may be to execute an editing program that allows the user to change various aspects of the 3D model, such as changing the color of the 3D model or the like. In some embodiments, the user interface logic 218 of the memory 210 may be accessed as part of providing the additional user options, receiving a user selection, and/or executing a corresponding command. The process may return to block 440.

If a determination is made at block 460 that additional data has been received from the sensor 125 (e.g., data indicating a change in the magnetic field), the model data may be updated at block 465 and the 3D model may be updated at block 470. That is, the additional sensed data may be analyzed and interpreted to generate data corresponding to an updated model, which is then provided via the display 225. More specifically, the sensed data may be analyzed to determine updated dimensional aspects of the magnetic field(s) 180 that were detected. Once the updated dimensional aspects of the magnetic fields are determined, the model data may be updated or amended based on the dimensional aspects of the magnetic fields and the 3D model may also be changed correspondingly. In some embodiments, the updated model data may be stored as a new version of the 3D model data 254 in the storage device 250. The process may then return to block 440 to display the updated 3D model.

Accordingly, it should now be understood that the systems and methods described herein allow for a malleable target object to be physically formed to a desired shape, which is then sensed such that a virtual 3D model of the target object can be rendered. The target object can be continuously reformed such that the virtual 3D model is updated to reflect the current shape, size, and/or configuration of the target object in real time. This may be accomplished by using a target object that contains components that are sensed, such as components containing magnetic properties that emit a particularly shaped magnetic field corresponding to the shape of the target object. The dimensional aspects of the magnetic field are detected by a magnetic sensor, which generates corresponding data that is used to create the virtual 3D model. As a result, users that are inexperienced with respect to CAD programming or the like can still obtain a virtual 3D model that can be used for any task commonly associated with 3D modeling, such as 3D printing, manufactured part blueprints, and/or the like.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of receiving dimensional aspects of a malleable target object, the method comprising:

forming the malleable target object into a shape having dimensional aspects from a malleable material comprising a magnetic component dispersed throughout the malleable material such that a magnetic field generated by the malleable target object comprises dimensional aspects that correspond to the shape having the dimensional aspects of the target object due to a strength and a direction of the magnetic field generated by the malleable target object;

placing the malleable target object within a sensed area such that a sensor senses the dimensional aspects of the magnetic field and generates sensed data corresponding to the dimensional aspects of the magnetic field; and receiving, from a computing device, the three dimensional computer rendering of the malleable target object, wherein the computing device generates the three dimensional computer rendering from the sensed data and outputs the three dimensional computer rendering such that the three dimensional computer rendering corresponds to the dimensional aspects of the shape of the malleable target object.

2. The method of claim 1, further comprising:

reshaping the malleable target object such that the magnetic component generates the magnetic field comprising second dimensional aspects that correspond to second dimensional aspects of the malleable target object, wherein the sensor senses the second dimensional aspects and generates second sensed data corresponding to the second dimensional aspects; and automatically receiving, from the computing device, an updated three dimensional rendering of the malleable target object, wherein the updated three dimensional rendering corresponds to the second dimensional aspects of the malleable target object.

3. The method of claim 1, wherein the dimensional aspects of the magnetic field comprise at least one of a shape, a size, and an orientation that correspond to a shape, a size and an orientation of the target object.

4. The method of claim 1, wherein the three dimensional computer rendering is a CAD file.

5. The method of claim 1, wherein the malleable material comprises at least one of iron, nickel, cobalt, manganese, a metallic alloy of any of the foregoing, carbonyl iron, chromium dioxide, a magnetic iron oxide, a magnetic ferrite, a magnetic hexaferrite, and a magnetic garnet.

6. The method of claim 1, wherein the sensor comprises at least one of a Hall sensor, a giant magnetoresistance sensor, an anisotropic magnetoresistance sensor, a magnetoresistive waveguide, and an electronic compass unit.

7. A method of detecting dimensional aspects of a malleable target object shaped to have dimensional aspects and comprising a malleable material having a magnetic component dispersed throughout the malleable material, the method comprising:

directing, by a processing device, a sensor to sense dimensional aspects of a magnetic field generated by the magnetic component dispersed throughout the malleable material of the malleable target object, wherein the dimensional aspects of the magnetic field corresponds to dimensional aspects of the malleable target object due to a strength and a direction of the magnetic field generated by the malleable target object;
receiving, by the processing device, sensed data from the sensor, the sensed data corresponding to the dimensional aspects of the magnetic field; and
generating, by the processing device, a three dimensional rendering of the malleable target object from the sensed data.

8. The method of claim 7, further comprising:
directing, by the processing device, a display to display the three dimensional rendering of the malleable target object.

9. The method of claim 7, further comprising:
receiving, by the processing device, updated sensed data from the sensor, the updated sensed data corresponding to second dimensional aspects of the magnetic field that correspond to second dimensional aspects of the malleable target object that has been reshaped;
automatically generating, by the processing device, an updated three dimensional rendering of the malleable target object, wherein the updated three dimensional rendering corresponds to the second dimensional aspects of the malleable target object; and
automatically directing, by the processing device, the display to display the updated three dimensional rendering.

10. The method of claim 7, further comprising, prior to directing the sensor:
receiving, by the processing device, an input corresponding to a request for detecting the malleable target object.

11. The method of claim 7, further comprising:
providing, by the processing device, one or more user interface options with the three dimensional rendering, wherein the one or more user interface options comprise options for at least one of altering the three dimensional rendering, reproducing the three dimensional rendering, and transmitting the three dimensional rendering.

12. The method of claim 7, wherein directing the sensor to sense the dimensional aspects of the magnetic field comprises directing the sensor to sense one or more of a shape of the magnetic field, a size of the magnetic field, and an orientation of the magnetic field.

13. The method of claim 7, wherein generating the three dimensional rendering comprises:
generating, by the processing device, model data that corresponds to the sensed data received from the sensor; and
generating, by the processing device, the three dimensional rendering from the model data.

14. A system for detecting dimensional aspects of a malleable target object shaped to have dimensional aspects and comprising a malleable material having a magnetic component dispersed throughout the malleable material, the system comprising:
a sensor;
a processing device communicatively coupled to the sensor; and
a non-transitory, processor-readable storage medium, the non-transitory, processor-readable storage medium comprising one or more programming instructions that, when executed, cause the processing device to:
direct the sensor to sense dimensional aspects of a magnetic field generated by the magnetic component dispersed throughout the malleable material of the malleable target object, wherein the dimensional aspects of the magnetic field corresponds to dimensional aspects of the malleable target object due to a strength and a direction of the magnetic field generated by the malleable target object,
receive sensed data from the sensor, the sensed data corresponding to the dimensional aspects of the magnetic field, and
generate a three dimensional rendering of the malleable target object from the sensed data.

15. The system of claim 14, wherein the non-transitory, processor-readable storage medium further comprises one or more programming instructions that, when executed, cause the processing device to:
direct a display to display the three dimensional rendering of the malleable target object.

16. The system of claim 14, wherein the non-transitory, processor-readable storage medium further comprises one or more programming instructions that, when executed, cause the processing device to:
receive updated sensed data from the sensor, the updated sensed data corresponding to second dimensional aspects of the magnetic field that correspond to second dimensional aspects of the malleable target object that has been reshaped,
automatically generate an updated three dimensional rendering of the malleable target object, wherein the updated three dimensional rendering corresponds to the second dimensional aspects of the malleable target object, and
automatically direct the display to display the updated three dimensional rendering.

17. The system of claim 14, wherein the non-transitory, processor-readable storage medium further comprises one or more programming instructions that, when executed, cause the processing device to:
provide one or more user interface options with the three dimensional rendering, wherein the one or more user interface options comprise options for at least one of altering the three dimensional rendering, reproducing the three dimensional rendering, and transmitting the three dimensional rendering.

18. The system of claim 14, wherein the one or more programming instructions that, when executed, cause the processing device to direct the sensor to sense the dimensional aspects of the magnetic field further causes the processing device to direct the sensor to sense one or more of a shape of the magnetic field, a size of the magnetic field, and an orientation of the magnetic field.

19. The system of claim 14, wherein the one or more programming instructions that, when executed, cause the processing device to generate the three dimensional rendering further causes the processing device to:
generate model data that corresponds to the sensed data received from the sensor; and
generate the three dimensional rendering from the model data.

20. The system of claim 14, wherein the sensor comprises at least one of a Hall sensor, a giant magnetoresistance sensor, an anisotropic magnetoresistance sensor, a magnetoresistive waveguide, and an electronic compass unit.

* * * * *